(12) United States Patent
Mizutani et al.

(10) Patent No.: US 8,311,247 B2
(45) Date of Patent: Nov. 13, 2012

(54) PIEZOELECTRIC BODY MODULE AND MANUFACTURING METHOD THEREFOR

(75) Inventors: Atsuhito Mizutani, Kyoto (JP); Hideki Kojima, Niigata (JP); Katuhiro Makihata, Kanagawa (JP)

(73) Assignee: Panasonic Corporation, Osaka (JP)

( * ) Notice: Subject to any disclaimer, the term of this patent is extended or adjusted under 35 U.S.C. 154(b) by 444 days.

(21) Appl. No.: 12/617,309

(22) Filed: Nov. 12, 2009

(65) Prior Publication Data

US 2010/0124344 A1    May 20, 2010

(30) Foreign Application Priority Data

Nov. 17, 2008  (JP) .................................. 2008-293732
Sep. 1, 2009  (JP) .................................. 2009-201728

(51) Int. Cl.
*H04R 25/00* (2006.01)
(52) U.S. Cl. .................. 381/190; 381/114; 381/173
(58) Field of Classification Search .................. 381/190, 381/114, 173; 257/416
See application file for complete search history.

(56) References Cited

U.S. PATENT DOCUMENTS

| 7,936,056 B2 * | 5/2011 | Hatakeyama ................. 257/682 |
| 2004/0238821 A1 * | 12/2004 | Yang .............................. 257/72 |
| 2007/0058826 A1 | 3/2007 | Sawamoto et al. |
| 2008/0298621 A1 * | 12/2008 | Theuss et al. ................. 381/360 |

FOREIGN PATENT DOCUMENTS

| JP | 2007-081614 A |   | 3/2007 |
| JP | 2008-088470 | * | 3/2008 |

* cited by examiner

*Primary Examiner* — Curtis Kuntz
*Assistant Examiner* — Amir Etesam
(74) *Attorney, Agent, or Firm* — McDermott Will & Emery LLP

(57) ABSTRACT

In order to miniaturize a piezoelectric body module, in which a rhombus-shaped electronic part 4 and a polygonal-shaped electronic part 5 are arranged on a rectangular substrate 2: the rhombus-shaped electronic part 4 is arranged on the substrate 2 such that a side 105 of the substrate 2 and a side 101 of the rhombus-shaped electronic part 4 are parallel to each other; and the polygonal-shaped electronic part 5 is arranged on the substrate 2 such that a side 104 of the rhombus-shaped electronic part 4 and a side 109 of the polygonal-shaped electronic part 5 are parallel to each other.

13 Claims, 8 Drawing Sheets

PIEZOELECTRIC BODY MODULE AND MANUFACTURING METHOD THEREFOR

BACKGROUND OF THE INVENTION

1. Field of the Invention

The present invention relates to a piezoelectric body module that is used in a mobile phone, a hearing aid, and the likes. In particular, the present invention relates to a structure of a piezoelectric body module adapting to a miniaturization of a mobile phone, a hearing aid, and the like; and a manufacturing method of the piezoelectric body module.

2. Description of the Background Art

In recent years, MEMS (Micro-Electro-Mechanical Systems) technology that uses semiconductor microfabrication technologies for forming an electromechanical part is gathering attention; and development of MEMS technology is active in various fields, such as the machinery field, the electronics field, the communication field, the medical field, and the like. One example is a development of a technology that allows a miniaturization of a microphone module by mounting a microphone chip and an amplifier chip on the same substrate.

For example, patent document 1 (Japanese Laid-Open Patent Publication No. 2007-81614) discloses a capacitor microphone to which MEMS technology is applied. FIG. 14 shows a configuration of the capacitor microphone disclosed in patent document 1. According to patent document 1, the capacitor microphone has a configuration including: a rectangular microphone element 20 that includes a silicon substrate 22 on which a central opening portion is formed, and on which a vibrating membrane 24 and a fixed electrode 26 are arranged facing each other; an IC chip 70 for signal amplification, which is disposed on an insulative substrate 42 together with the microphone element 20; and a sound hole 42a provided for introducing a sound to a part positioned in the central opening portion of the microphone element 20 on the insulative substrate 42. As described here, the miniaturization of the microphone module is conducted by arranging the microphone element 40 and the IC chip 70 on the same insulative substrate 42.

SUMMARY OF THE INVENTION

However, in the configuration of the microphone module described in patent document 1, a microphone chip (microphone element) which is roughly a square, and an amplifier chip (IC chip) which is roughly a square and which is smaller than the microphone chip, are disposed on a rectangular resin substrate (insulative substrate) with a side facing a side of the others. That is, the microphone chip, the amplifier chip, and the resin substrate are arranged so that sides that are adjacent to each other are parallel; therefore, due to a size difference of these chips, an unused space exists which is not provided with any of the microphone chip, the amplifier chip, or an electrode land (electrically conductive layer), and which is not an area necessary for conducting a wire bonding process. FIG. 8 shows: a typical configuration of the capacitor microphone disclosed in patent document 1, and a location of an unused space 18. Furthermore, electrode lands are arranged around these chips, leading to an enlargement of the size of the resin substrate. As described above, the microphone module disclosed in patent document 1 includes wasted area that leads to an enlarged size, thus the miniaturization is not conducted sufficiently.

Presently, a more miniaturized microphone chip having a rhombus shape is available; however, if the conventional arrangement were to be applied, a miniaturization of the whole microphone module cannot be achieved even when the square microphone chip is substituted with a more miniaturized rhombus-shaped microphone chip, merely increasing the size of the unused space on the resin substrate.

Therefore, an objective of the present invention is to miniaturize a piezoelectric body module that includes a rectangular substrate on which a rhombus-shaped piezoelectric element and a polygonal-shaped amplifying element are arranged.

In order to solve the above described problem, a piezoelectric body module according to the present invention includes: a substrate having a rectangular shape; a first electronic part having a rhombus shape, and a second electronic part having a polygonal shape, and the first electronic part is arranged on the substrate such that one side of the substrate and a first side which is a side of the first electronic part are parallel to each other, and the second electronic part is arranged on the substrate such that one side of the first electronic part, which one side is not parallel to the first side, and one side of the second electronic part are parallel to each other. Furthermore, at least a part of the second electronic part may be arranged on an area of the substrate between the first electronic part, and a straight line, which is a line perpendicular to the first side of the first electronic part, and which passes through, among vertexes located at acute angles of the first electronic part, a vertex located closer to the second electronic part.

According to the present invention, miniaturization of the piezoelectric body module can be achieved, by adopting the rhombus-shaped piezoelectric element as the first electronic part and the polygonal-shaped amplifying element as the second electronic part, and by arranging, on the rectangular substrate, the first electronic part, the second electronic part, and an electrode land so as to reduce the unused space while ensuring a space to conduct a wire bonding.

The present invention is intended for miniaturization of the piezoelectric body module, and is useful in miniaturization and weight reduction of a mobile device and the like, such as a mobile phone.

The disclosures of Japanese Patent Application No. 2008-293732 filed Nov. 17, 2008, and Japanese Patent Application No. 2009-201728 filed Sep. 1, 2009, including specifications, drawings, and claims are incorporated herein by reference in their entirety.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
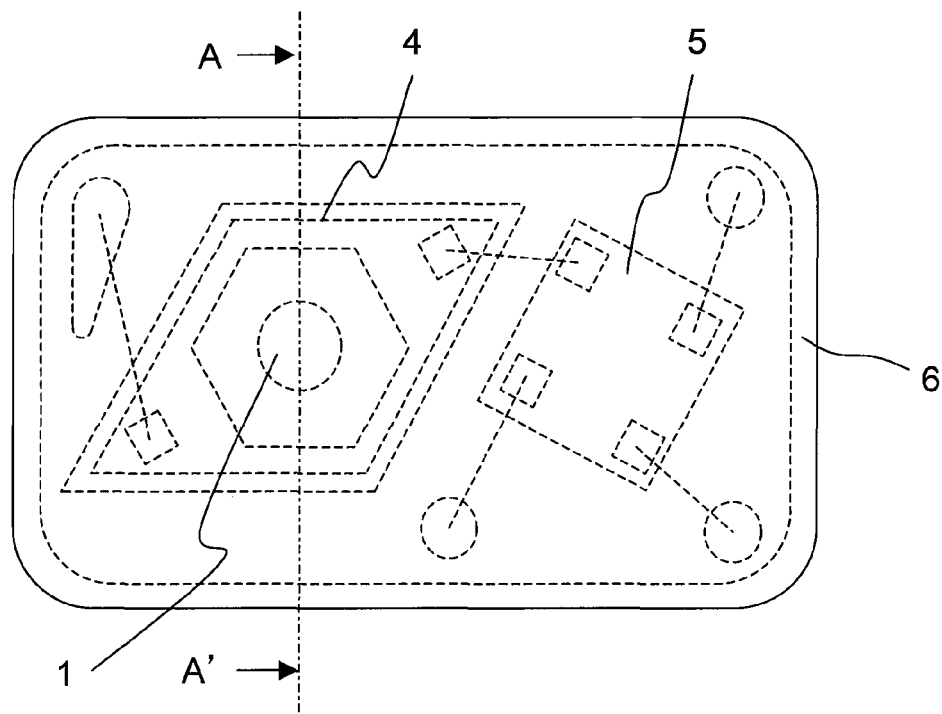
FIG. 1 is a plain view of a piezoelectric body module according to one embodiment of the present invention.
Figure 2:
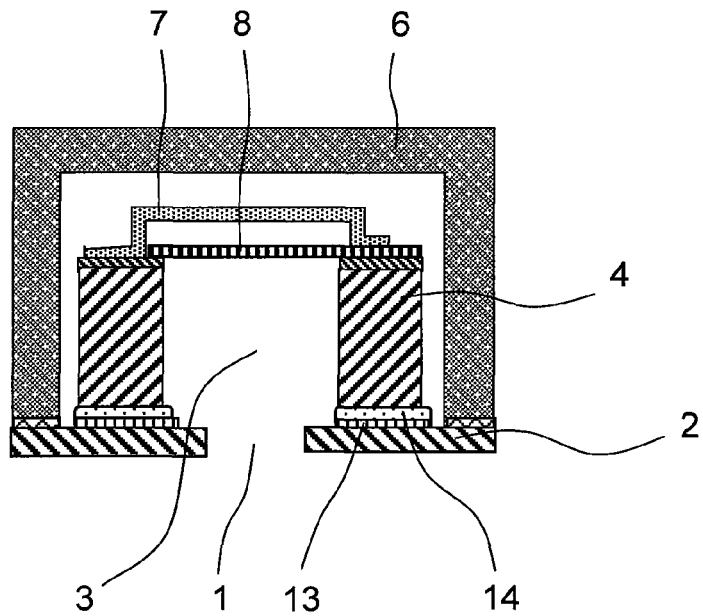
FIG. 2 is a view of a cross section at a line A-A' in FIG. 1.

An embodiment according to the present invention will be described in the following with reference to drawings. As shown in FIG. 1 and FIG. 2, a silicon microphone module (piezoelectric body module) according to the current embodiment includes: a sound hole 1 for introducing a sound; a substrate 2 having a rectangular shape; a first electronic part 4 having a rhombus shape; a second electronic part having a polygonal shape; and a cap 6 that covers the first electronic part 4 and the second electronic part 5. In the current embodiment, the substrate 2 is a resin substrate 2 obtained by impregnating a material with a resin. Furthermore, the first electronic part 4 is a silicon microphone chip (a piezoelectric element) 4 including a hexagonal opening portion 3 in a position above the sound hole 1; and the second electronic part 5 is a CMOS amplifier chip (an amplifying element) 5. The silicon microphone chip 4 and the CMOS amplifier chip 5 are fixed on the resin substrate 2 via a fixing pad 13 and an adhesive 14.

A sound introduced from the sound hole 1 is converted into an electrical signal at a vibrating membrane 8 disposed at a position below a fixed membrane 7 of the silicon microphone chip 4; and after the signal is amplified by the CMOS amplifier chip 5, the signal is supplied to a controlling section of an electronic device such as, for example, a mobile phone and the like.

Figure 3:
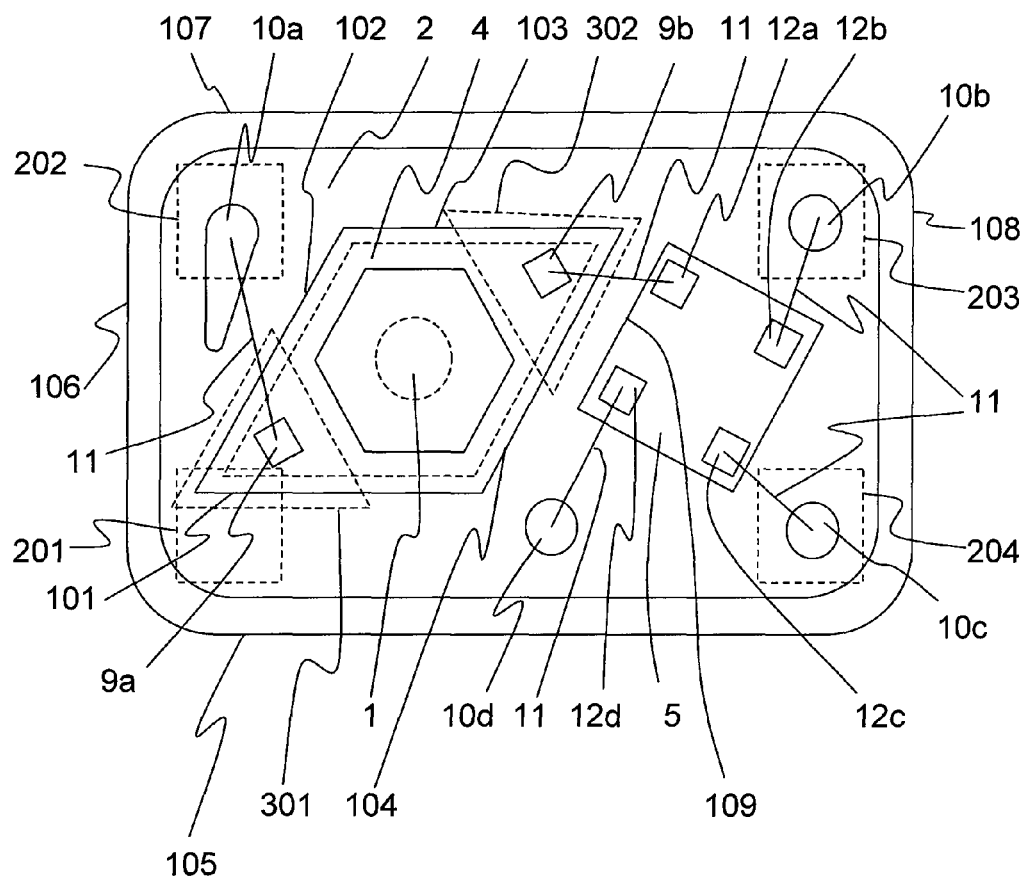
FIG. 3 is a plain view for showing a manufacturing method of the piezoelectric body module according to one embodiment of the present invention.

As shown in FIG. 3, the silicon microphone chip 4 has a rhombus shape including two pairs of parallel sides, a side 101 and a side 103, and a side 102 and a side 104; and the silicon microphone chip 4 includes an electrode pad 9a and an electrode pad 9b, which are respectively disposed on an upper surface of an acute angle area 301, which is a apex part of an acute angle formed by the side 101 and the side 102, and on an upper surface of an acute angle area 302, which is a apex part of an acute angle formed by the side 103 and the side 104. The CMOS amplifier chip 5 has a rectangular shape, and includes an electrode pad 12a, an electrode pad 12b, an electrode pad 12c, and an electrode pad 12d, which are each respectively disposed on one of four corner sections on an upper surface of the CMOS amplifier chip 5. Furthermore, the resin substrate 2 has a rectangular shape that is formed by two pairs of parallel sides, a side 105 and a side 107, and a side 106 and a side 108.

The silicon microphone chip 4 is arranged such that one side thereof is parallel to one side of the resin substrate 2. Here, the side 101 of the silicon microphone chip 4 is parallel to the side 105 of the resin substrate 2. In addition, the CMOS amplifier chip 5 is arranged such that one side thereof (e.g. side 109) is parallel to the side 104 of the silicon microphone chip 4.

The electrode pad 9b on the silicon microphone chip 4 and the electrode pad 12a on the CMOS amplifier chip 5 are connected via a wire 11. Thus, the silicon microphone chip 4 and the CMOS amplifier chip 5 are arranged having therebetween a distance necessary for conducting a wire bonding process.

The resin substrate 2 includes an electrode land 10a, an electrode land 10b, an electrode land 10c, and an electrode land 10d, which are respectively disposed on: a corner section 202; a corner section 203; a corner section 204, which are three among four corner sections excluding a corner section 201 where the acute angle area 301 is arranged; and a periphery of an obtuse angle part which is formed by the side 101 and the side 104 of the silicon microphone chip 4. A space that is large enough to ensure a minimum wire length necessary for conducting the wire bonding process is provided on peripheries of the electrode land 10a, the electrode land 10b, the electrode land 10c, and the electrode land 10d.

The electrode pad 9a on the silicon microphone chip 4 is connected to the electrode land 10a on the resin substrate 2 via the wire 11. The electrode pad 12b, the electrode pad 12c, and the electrode pad 12d, which are three electrode pads on the CMOS amplifier chip 5; are respectively connected, via the wire 11, to the electrode land 10b, the electrode land 10c, and the electrode land 10d.

By adopting an arrangement described above using a rhombus-shaped silicon microphone chip 4, it is possible to reduce a ratio of an area size of an unused space on the resin substrate 2, the unused space being an area not provided with the silicon microphone chip 4 or the CMOS amplifier chip 5, nor utilized as an area for conducting the wire bonding or arranging an electrode land; thus, allowing a miniaturization of the resin substrate 2, and also making it possible to attain a miniaturization of the whole silicon microphone module.

With reference to FIG. 8 to FIG. 13, an explanation for how the rectangular resin substrate 2 can be miniaturized will be shown in the following, by describing a step-by-step virtual transition from a conventional chip arrangement to a chip arrangement of the current embodiment. For simplification, the wire 11, and a part in an outer circumference of the resin substrate 2 for mounting the cap 6, are omitted in the figures used for the description.

Figure 8:
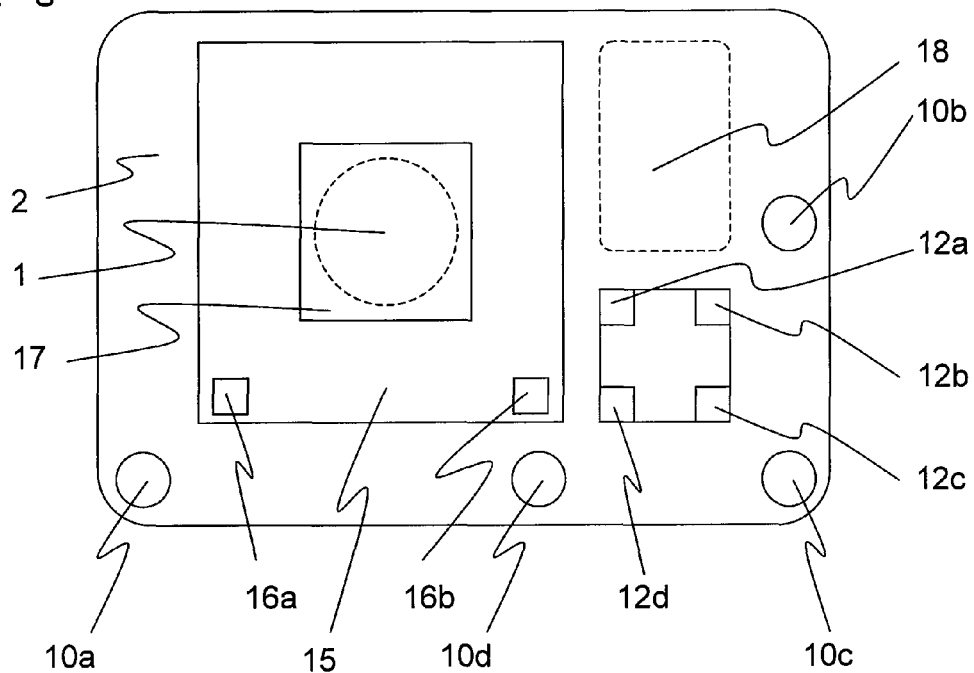
FIG. 8 is a plain view for describing an advantageous effect of the piezoelectric body module according to one embodiment of the present invention.
Figure 14:
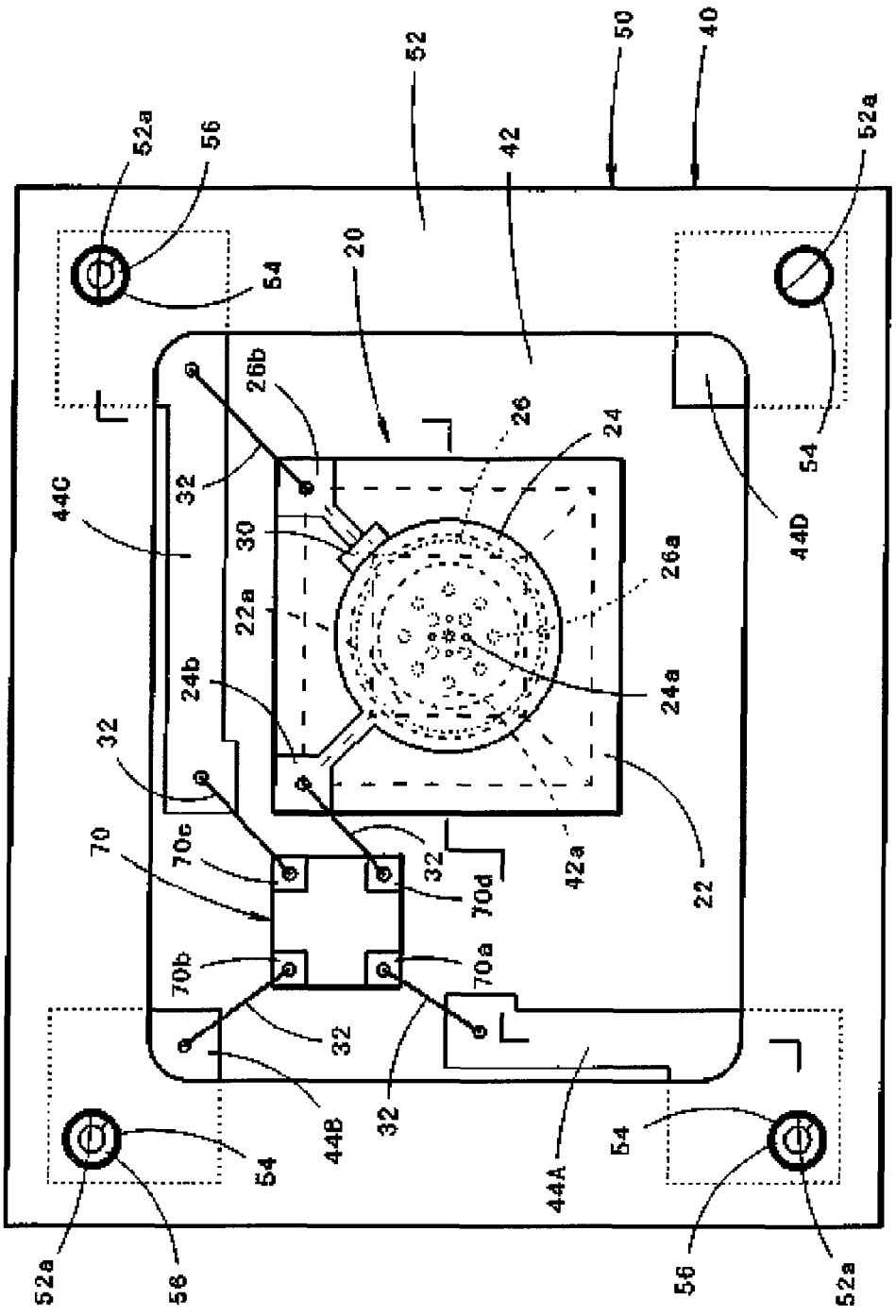
FIG. 14 is a plain view showing one configuration example of a conventional piezoelectric body module.

FIG. 8 shows a typical configuration of the conventional chip arrangement. A conventional silicon microphone chip 15, which includes, on an upper surface thereof, electrode pads 16a and 16b; and a conventional CMOS amplifier chip 5, which includes, on an upper surface thereof, electrode pads 12a, 12b, 12c, and 12d; both roughly have a square shape. The conventional microphone chip 15 and the conventional CMOS amplifier chip 5 are arranged such that: each of the sides are parallel to a side of the resin substrate 2; and one side of the microphone chip 15 and one side of the CMOS amplifier chip 5 are aligned on a straight line. In addition, the electrode land 10a, the 10b, the 10c, and the 10d are arranged on an outer circumference section of the resin substrate 2. Here, to allow an easy comparison, a size ratio of a conventional microphone element 20 and a conventional IC chip 70 shown in FIG. 14 is applied as a size ratio of the conventional silicon microphone chip 15 and the conventional CMOS amplifier chip 5. Furthermore, the electrode land 10a, the electrode land 10b, the electrode land 10c, and the electrode land 10d are disposed at positions that are identical to where the wire 11 is connected on the electrically conductive layer of the conventional resin substrate.

Figure 9:
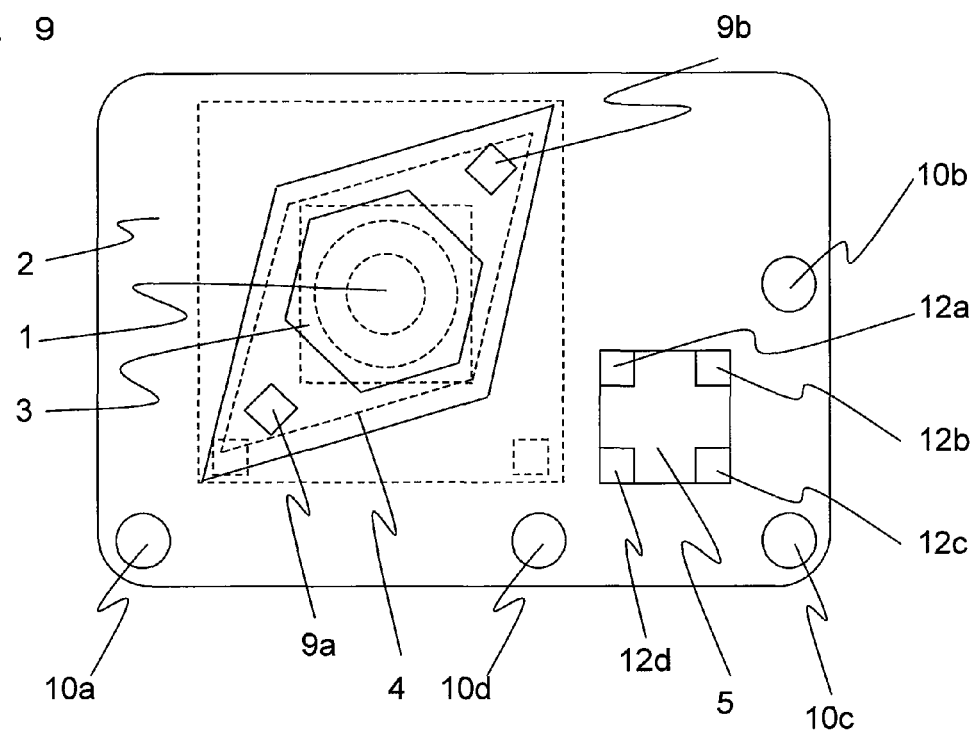
FIG. 9 is a plain view for describing the advantageous effect of the piezoelectric body module according to one embodiment of the present invention.

First, as shown in FIG. 9 with a solid line, the conventional silicon microphone chip 15 is substituted with the rhombus-shaped silicon microphone chip 4 of the current embodiment. The silicon microphone chip 4 is miniaturized when compared to the conventional silicon microphone chip 15 that has an opening portion area size identical to the silicon microphone chip 4. Thus, the rhombus-shaped silicon microphone chip 4, which includes the hexagonal opening portion 3 having an area size identical to a square opening portion 17 of the conventional silicon microphone chip 15, can be fitted in the area where the conventional silicon microphone chip 15 has been arranged, with an arrangement where a diagonal line of the conventional silicon microphone chip 15 and a diagonal line of the silicon microphone chip 4 overlaps. Additionally, the size of the sound hole 1 can also be reduced when compared to a conventional sound hole. Here, the electrode pad 9a and the electrode pad 9b are disposed near the acute angles of the rhombus shape, outside of the opening portion of the silicon microphone chip 4; and the CMOS amplifier chip 5 is not substituted and the conventional CMOS amplifier chip 5 is used.

Figure 10:
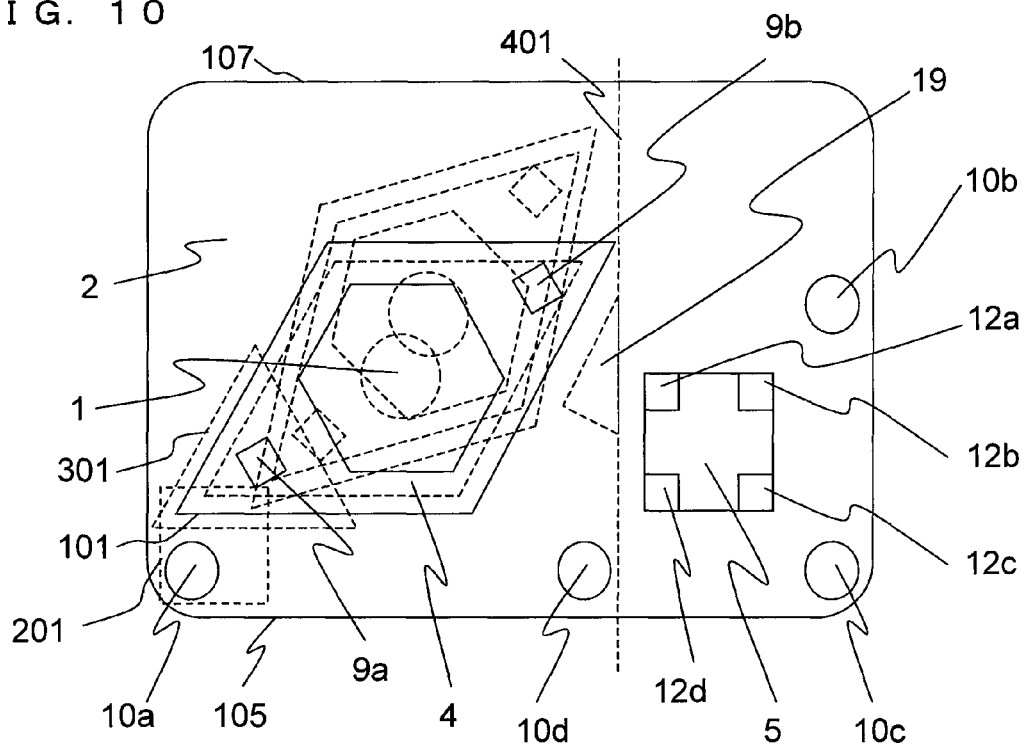
FIG. 10 is a plain view for describing the advantageous effect of the piezoelectric body module according to one embodiment of the present invention.

As shown in FIG. 10 with a solid line, by rotating and moving the silicon microphone chip 4, the side 101 of the silicon microphone chip 4 is arranged parallel to the side 105 of the resin substrate 2, and an acute angle area 301 of the silicon microphone chip 4 is arranged in proximity of the corner section 201 of the resin substrate 2. A position of the sound hole 1 on the resin substrate 2 is also moved in accordance with the movement of the silicon microphone chip 4.

Figure 11:
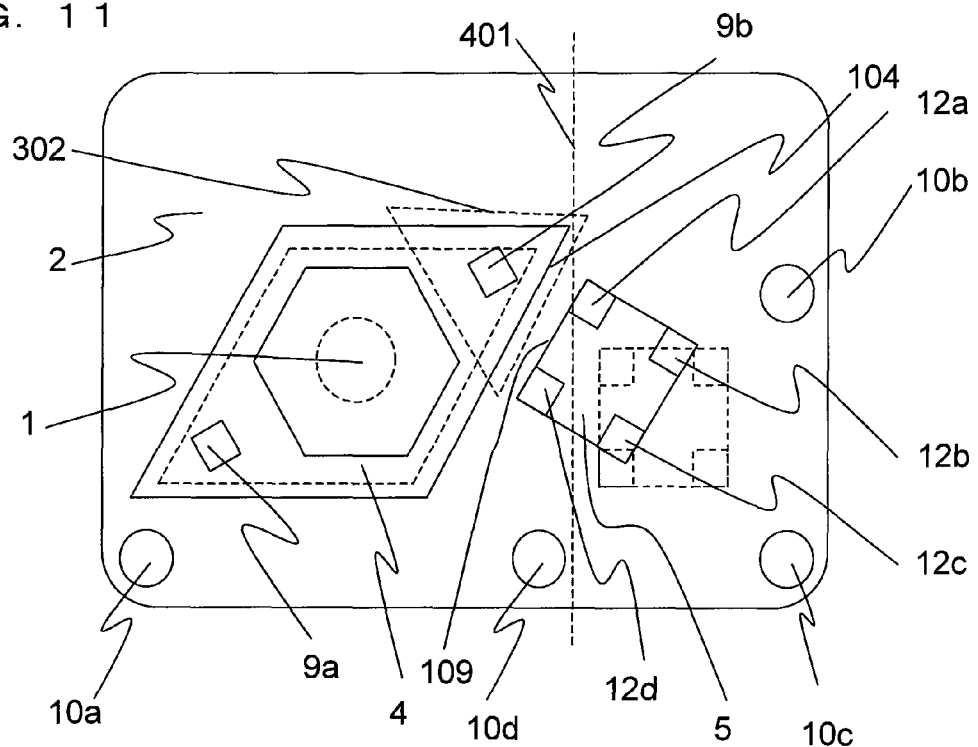
FIG. 11 is a plain view for describing the advantageous effect of the piezoelectric body module according to one embodiment of the present invention.

As shown in FIG. 11 with a solid line, by rotating and moving the CMOS amplifier chip 5, the side 109 of the CMOS amplifier chip 5 is arranged parallel to the side 104 of the silicon microphone chip 4 and in proximity of the silicon microphone chip 4, while maintaining a distance necessary for conducting a wire bonding process in between the electrode pad 12a on the CMOS amplifier chip 5 and the electrode pad 9b on the silicon microphone chip 4.

Here, in FIG. 10, assume a perpendicular line 401 which passes through a vertex in the acute angle area 302 of the silicon microphone chip 4, and which is perpendicular to the side 105 and the side 107 of the resin substrate 2. Then, focus attention on an unused space 19 in between the perpendicular line 401 and the silicon microphone chip 4. This unused space 19 is generated as a result of substituting the conventional silicon microphone chip 15 to a rhombus-shaped silicon microphone chip 4. As shown in FIG. 11, the unused space 19 shown in FIG. 10 can be eliminated if the CMOS amplifier chip 5 is moved such that the electrode pad 12d of the CMOS amplifier chip 5 crosses over the perpendicular line 401.

Figure 12:
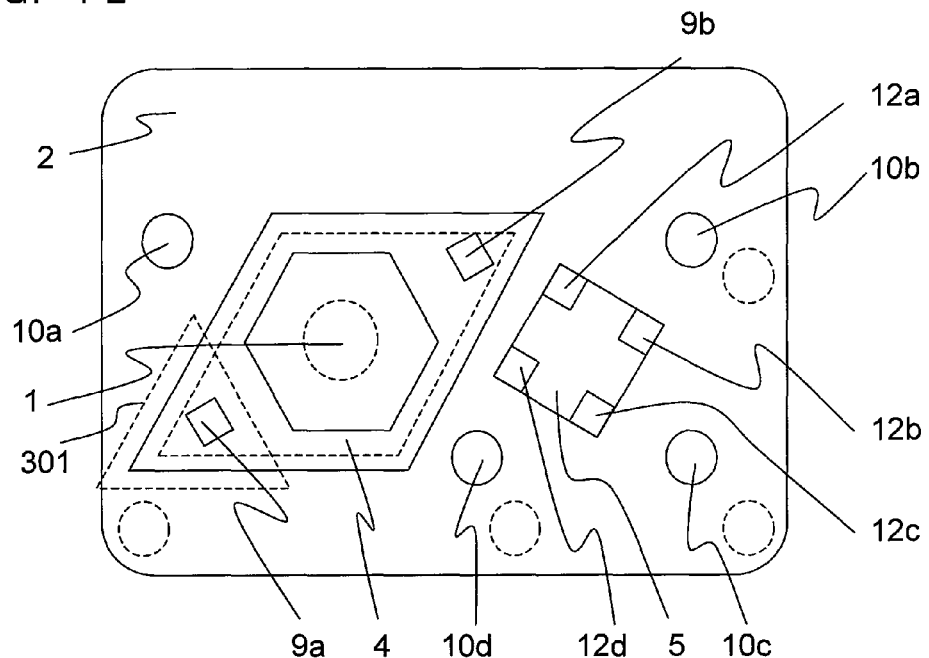
FIG. 12 is a plain view for describing the advantageous effect of the piezoelectric body module according to one embodiment of the present invention.

Next, as shown in FIG. 12 with a solid line, while ensuring a distance necessary for conducting a wire bonding process, the electrode land 10b, the electrode land 10c, and the electrode land 10d are respectively disposed in proximity of the electrode pad 12b, the electrode land 12c, and the electrode land 12d, to which a connection is formed via the wire respectively. A distance of 300 μm is sufficient as a distance necessary for conducting a wire bonding process between electrode pads, or between an electrode pad and an electrode land. Furthermore, the electrode land 10a is moved passing the acute angle area 301 of the silicon microphone chip 4.

Although the distance between the electrode land 10a and the electrode pad 9a will become longer than a distance between another electrode pad and another electrode land; this will not be a problem as long as the distance is within a range that does not affect a quality of the wire bonding process.

Figure 13:
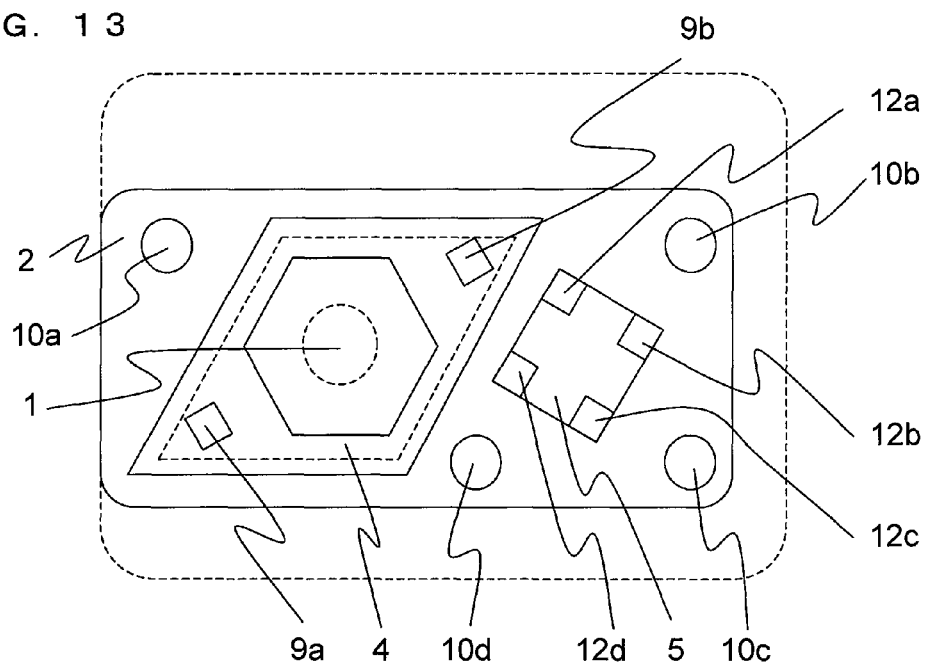
FIG. 13 is a plain view for describing the advantageous effect of the piezoelectric body module according to one embodiment of the present invention.

As a result, as shown in FIG. 13, the unused space is moved to the outer circumference section of the resin substrate 2 indicated by a dashed line. Then, by removing the unused space part, as shown with a solid line, a miniaturization can be conducted while maintaining the rectangular shape of the resin substrate 2. In the conventional microphone module, parts that correspond to the electrode land 10a and the electrode land 10d of the present invention are electrically connected to each other. In the present invention, if necessary, the electrode land 10a and the electrode land 10d can be electrically connected by providing an electrically conductive layer to the interior of the resin substrate 2 so as to bypass the sound hole 1.

Here the silicon microphone chip 4 has a configuration where the longer diagonal line, of the two diagonal lines, has a length that is identical to a length of a diagonal line of the conventional silicon microphone chip 15, and where an acute angle of the rhombus shape is 60 degrees. Furthermore, the CMOS amplifier chip 5 having a conventional size is used without any alterations. Nevertheless, the size of the silicon microphone chip 4, angles of the rhombus shape, and the size of the CMOS amplifier chip may be altered as long as the advantageous effect of the present invention can be obtained.

In a preferred example, the silicon microphone chip 4 includes a side having a length of 0.875 mm and an acute angle that is 70.6 degrees; and the CMOS amplifier chip 5 includes a square shape with a side having a length of 0.7 mm. A size of the resin substrate 2 obtained as a result of this example is 2 mm×3 mm.

With reference to FIG. 2, and FIG. 4 to FIG. 7, a manufacturing method of the silicon microphone module described above will be described in the following.

First, the resin substrate 2 including: the sound hole 1; the electrode land 10a; the electrode land 10b; the electrode land 10c; and the electrode land 10d, all of which are disposed in predefined locations, is prepared. The electrode land 10a, the electrode land 10b, the electrode land 10c, and the electrode land 10d of the resin substrate 2 are obtained: by performing a nickel-plating on a copper base layer; or by additionally performing a gold-plating; or by performing a nickel-plating on a copper base layer, then performing a lead-plating, and then performing a gold-plating.

Figure 4:
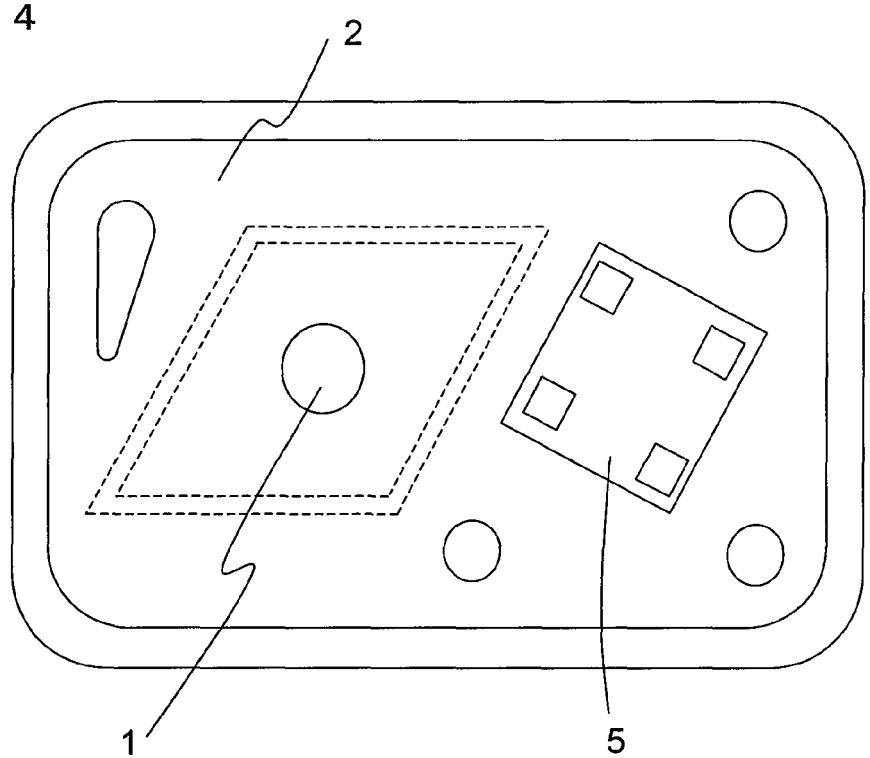
FIG. 4 is a plain view for showing the manufacturing method of the piezoelectric body module according to one embodiment of the present invention.

Next, on a predefined area of the resin substrate 2: the fixing pad 13 is patched; the adhesive 14 is applied; and a die-bonding area of a bottom surface of the CMOS amplifier chip 5 is fixed and mounted, as shown in FIG. 4. In order to harden the adhesive 14, the resin substrate 2 is heat-treated at 150 to 200° C. for 1 hour in a nitrogen atmosphere, and the resin substrate 2 is taken out after being cooled down to a temperature of 100° C. or lower. The fixing pad 13 and the adhesive 14 is shown in FIG. 2.

Figure 5:
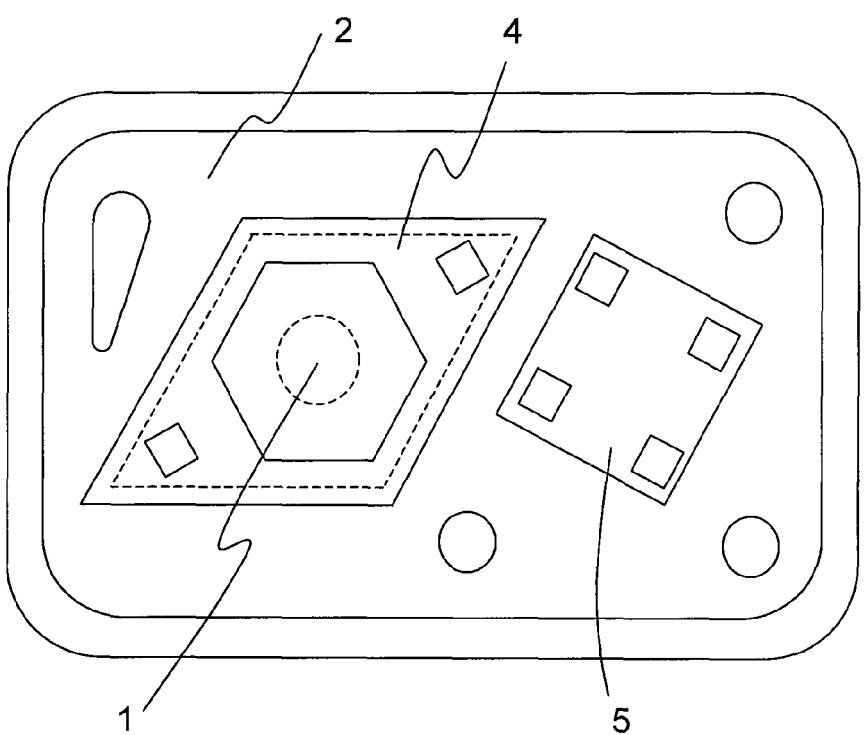
FIG. 5 is a plain view for showing the manufacturing method of the piezoelectric body module according to one embodiment of the present invention.

Next, as shown in FIG. 5, on a predefined area surrounding the sound hole 1: the fixing pad 13 is patched; the adhesive 14 is applied; and a die-bonding area on an outer circumference section of a bottom surface of the silicon microphone chip 4, excluding an opening portion (not diagrammatically represented), is mounted so as to allow the opening portion to overlap with the sound hole 1. In order to harden the adhesive 14, the resin substrate 2 is heat-treated at 150 to 200° C. for 1 hour in a nitrogen atmosphere, and the resin substrate 2 is taken out after being cooled down to a temperature of 100° C.

or lower. The heat treatment may be conducted after both the CMOS amplifier chip 5 and the silicon microphone chip 4 are mounted.

A conductive paste, an insulative paste, or a die-attach film may be used as the adhesive; or a combination of these adhesives may be used, for example, such as using the die-attach film for mounting the CMOS amplifier chip 5 and the insulative paste for mounting the silicon microphone chip 4.

Figure 6:
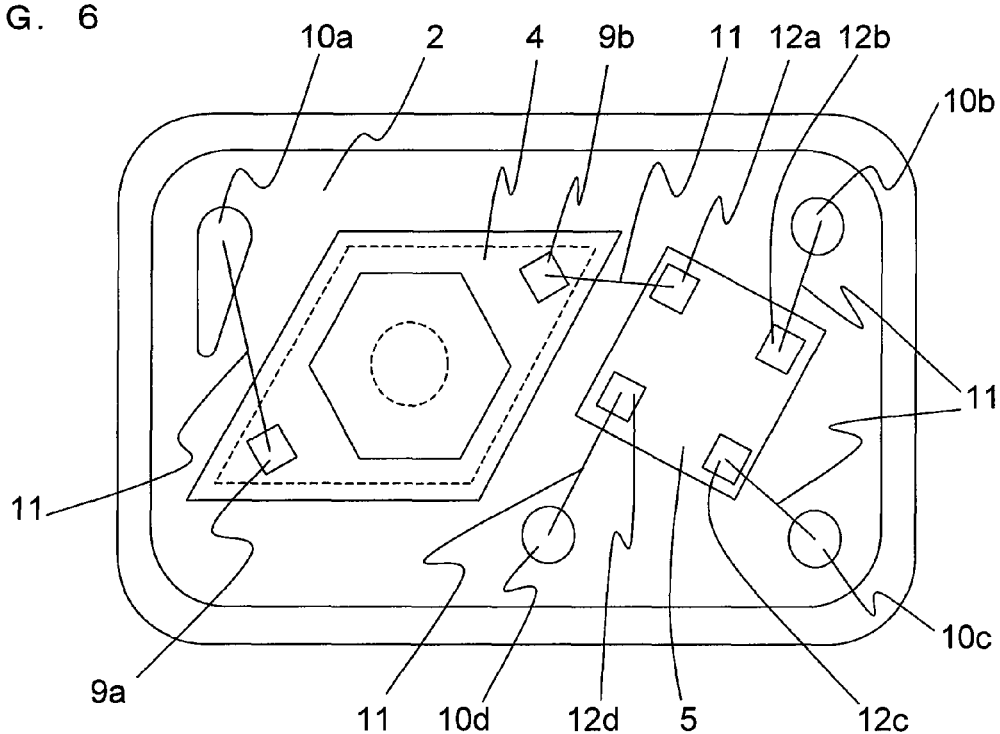
FIG. 6 is a plain view for showing the manufacturing method of the piezoelectric body module according to one embodiment of the present invention.

Next, as shown in FIG. 6, at room temperature, the electrode pad 9a at the acute angle area on an upper surface of the silicon microphone chip 4, and the electrode land 10a in a corner section of the resin substrate 2 are connected via the wire 11; and the electrode pad 12a on the CMOS amplifier chip 5 and the electrode pad 9b on the silicon microphone chip 4 are connected via the wire 11. In addition, the electrode pad 12b, the electrode pad 12c, and the electrode pad 12d on the CMOS amplifier chip 5 are respectively connected via the wire 11 with the electrode land 10b, the electrode land 10c, and the electrode land 10d of the resin substrate 2.

A material of the electrode pad 9a and the electrode pad 9b on the silicon microphone chip 4 is, for example, Poly-Si (polysilicon).

The surface of the electrode pad 12a, the electrode pad 12b, and the electrode pad 12c on the CMOS amplifier chip 5 is formed from, for example, Al, Al—Si, Al—Si—Cu (which are all aluminum based), and Au (gold).

An aluminum based material, or gold may be used as a material for the wire 11. If the material of the wire 11 is gold, after mounting chips on the resin substrate 2, the wire bonding can be conducted on a heater that is heated to a temperature of 130 to 180° C.

The diameter of the electrode land 10a, the electrode land 10b, the electrode land 10c, and the electrode land 10d of the resin substrate 2 are, approximately 200 to 250 μm when an aluminum based wire having a diameter of approximately 20 to 30 μm is used as the wire 11; and approximately 150 to 200 μm when a gold wire having a diameter of approximately 15 to 25 μm is used. Therefore, a further miniaturization can be achieved by using a gold wire.

The wire bonding process is conducted using an ultrasonic wave output and a pressure load, which depend on the material and shape of the electrode pad, the electrode land, and the wire, a fixing condition, and the like. When compared to a case where the electrode pad 12a, the electrode pad 12b, the electrode pad 12c, and the electrode pad 12d on the CMOS amplifier chip 5, which include an aluminum based material or gold, are bonded to a wire including an aluminum based material or gold, bonding is conducted using a condition which is a larger ultrasonic wave output and a lower load, in a case, for example, where the electrode pad 9a and the electrode pad 9b on the silicon microphone chip 4, which include polysilicon as a material, are bonded to a wire including an aluminum based material. As a result, the wire bonding process on an electrode including polysilicon as a material is made possible, and a manufacturing cost can be reduced by eliminating a process of forming a mask that includes an aluminum based material or gold.

Furthermore, in order to prevent interference between a bonding tool and the silicon microphone chip 4 or the CMOS amplifier chip 5, the wire bonding process is conducted in a suitable order that depends on the thickness of the chip, and the like. For example, if a thickness of the silicon microphone chip 4 is larger than a thickness of the CMOS amplifier chip 5, when connecting the electrode pad 9b on the silicon microphone chip 4 and the electrode pad 12a on the CMOS amplifier chip 5, the wire bonding process can be conducted without causing interference between the bonding tool and the silicon microphone chip 4 by connecting the wire 11 to the electrode pad 12a after connecting the wire 11 to the electrode pad 9b.

The electrode land of the resin substrate 2 does not necessarily have to be a round-shape, and as long as the external size of the silicon microphone module does not increase, the electrode land may be any suitable shape or may be connected to a plurality of wires. Here, the electrode land 10a has a shape resembling a circle having one part of the circle being distended.

Figure 7:
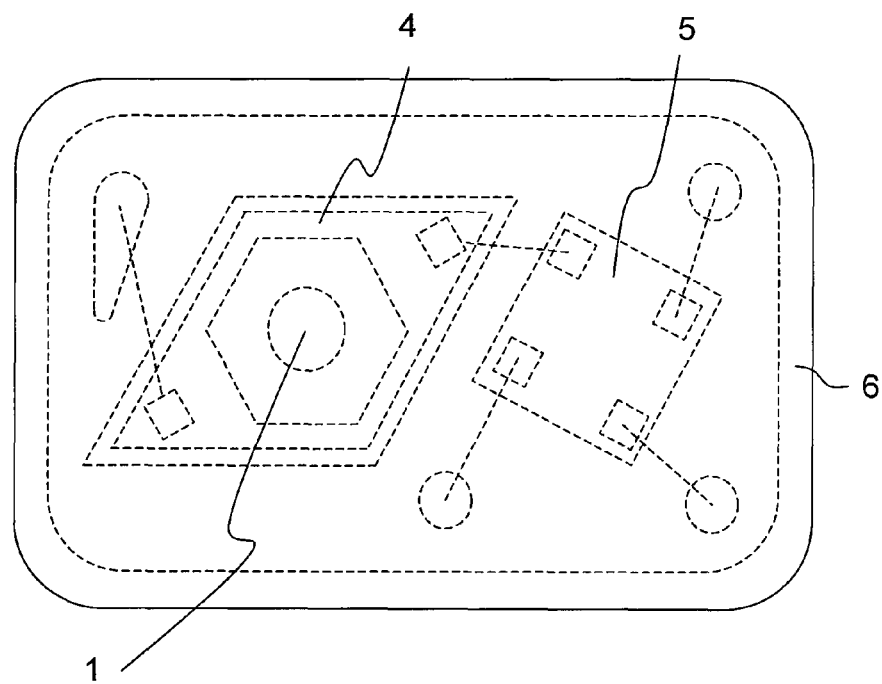
FIG. 7 is a plain view for showing the manufacturing method of the piezoelectric body module according to one embodiment of the present invention.

Next, as shown in FIG. 7, in order to provide an electromagnetic noise shielding property and a protection against a physical stress from outside, a cap is mounted and soldered onto the outer circumference section of the resin substrate 2.

Accordingly, the silicon microphone module described with reference to FIG. 1 and FIG. 2 can be manufactured. Although the substrate 2 is a resin substrate 2 obtained by impregnating a material with a resin in the current embodiment, the substrate 2 can be a substrate of another type. Furthermore, although the first electronic part 4 and the second electronic part 5 are respectively the silicon microphone chip 4 and the CMOS amplifier chip 5 in the current embodiment, the first electronic part 4 and the second electronic part 5 are not limited to these specific electronic parts; the first electronic part may be a piezoelectric element other than the silicon microphone chip 4 and the second electronic part may be an amplifying element other than the CMOS amplifier chip 5. An advantageous effect similar to the current embodiment can be obtained with other electronic parts having shapes similar to those in the current embodiment.

According to a preferred embodiment of the present invention: the first electronic part includes a side having a length of 0.85 to 1.20 mm and an acute angle that is 70.6 degrees; the second electronic part has a rectangular shape that includes a side having a length of 0.6 to 0.8 mm and another side having a length of 0.6 to 0.8 mm; and the substrate includes a side having a length of 1.9 to 2.4 mm, another side having a length of 2.9 to 3.4 mm, and four electrode lands. However, the present invention can be implemented and an advantageous effect thereof can be obtained even with numerical values beyond the ranges described above, as long as they are within the scope of the present invention. For example, the second electronic part may have a polygonal shape other than the rectangular shape.

While the invention has been described in detail, the foregoing description is in all aspects illustrative and not restrictive. It is understood that numerous other modifications and variations can be devised without departing from the scope of the invention.

What is claimed is:

1. A piezoelectric body module comprising: a substrate having a rectangular shape;
   a first electronic part having a rhombus shape and being disposed on the substrate, the rhombus shape including a first side and a second side that is not parallel to the first side; and a second electronic part having a polygonal shape and being disposed on the substrate, wherein:
   the first side of the rhombus shape of the first electronic part is parallel to one side of the substrate and one side of the polygonal shape of the second electronic part is parallel to the disposed on the substrate with a second side of the rhombus shape of first electronic part and at least a part of the second electronic part is disposed in an area on the substrate between the first electronic part and a straight line which is a line perpendicular to the first side of the rhombus shape of the first electronic part and which passes through, among vertexes located at acme angles of the first electronic part, a vertex located closer to the second electronic part.

2. The piezoelectric body module according to claim 1, wherein the first electronic part is a piezoelectric element and the second electronic part is an amplifying element.

3. The piezoelectric body module according to claim 1, wherein:
   the first electronic part and the second electronic part each include at least one electrode pad on an upper surface;
   the substrate includes at least one electrode land; and
   the electrode pad is connected, via a wire, to another electrode pad or to the electrode land on the substrate.

4. The piezoelectric body module according to claim 1, wherein the substrate includes a sound hole located immediately below an opening portion of the first electronic part.

5. The piezoelectric body module according to claim 1, wherein a die-bonding area is disposed at an outer circumference of a rear surface of the first electronic part, or on a whole surface of a rear surface of the second electronic part.

6. The piezoelectric body module according to claim 3, wherein at least one of the electrode pad on the first electronic part and the electrode pad on the second electronic part includes polysilicon as a material, and the wire connected to the at least one of the electrode pad includes an aluminum-based material.

7. The piezoelectric body module according to claim 3, wherein the wire connected to the at least one electrode land on the substrate includes an aluminum-based material, and a diameter of the at least one electrode land is from 200 to 250 lam.

8. The piezoelectric body module according to claim 3, wherein the wire connected to the at least one electrode land on the substrate includes gold, and a diameter of the at least one electrode land is from 150 to 200 lam.

9. The piezoelectric body module according to claim 1, wherein:
   the first electronic part includes an acute angle that is 70.6 degrees, and a side having a length of 0.85 to 1.20 mm;
   the second electronic part includes a side having a length of 0.6 to 0.8 mm and another side having a length of 0.6 to 0.8 mm; and
   the substrate includes a side having a length of 1.9 to 2.4 mm, another side having a length of 2.9 to 3.4 mm, and at least four electrode lands.

10. A method for manufacturing a piezoelectric body module that includes a first electronic part, a second electronic part, and a substrate on which the first electronic part and the second electronic part are arranged, the method comprising steps of:

preparing the substrate which includes, on an upper surface thereof, at least one electrode land, and which has a rectangular shape;
arranging a first electronic part which includes, on an upper surface thereof, at least one electrode pad, and which has a rhombus shape formed by a plurality of sides including a first side and a second side that is not parallel to the first side, such that one side of the substrate and the first side of the rhombus shape which is a side of the first electronic part are parallel to each other;
arranging a second electronic part which includes, on an upper surface thereof, at least one electrode pad, and which has a polygonal shape, such that the second side of the rhombus shape which is a side of the first electronic part and one side of the polygonal shape of the second electronic part are parallel to each other; and
connecting, by using a wire, the electrode pad on the first electronic part and the electrode pad on the second electronic part, to another electrode pad or the electrode land on the substrate and arranging at least a part of the second electronic part in an area on the substrate between the first electronic part and a straight line which is a line perpendicular to the first side of the rhombus of the first electronic part and which passes through, among vertexes located at acute angles of the first electronic part, a vertex located closer to the second electronic part.

11. The method according to claim 10, wherein the first electronic part is a piezoelectric element and the second electronic part is an amplifying element.

12. The method according to claim 10, wherein in a case of connecting the electrode pad on the first electronic part and the electrode pad on the second electronic part by using a wire, an electrode pad that has a larger thickness, among the electrode pad on the first electronic part and the electrode pad on the second electronic part, is first connected with the wire.

13. The method according to claim 10, wherein in a case where at least one of the electrode pad on the first electronic part and the electrode pad on the second electronic part, which includes polysilicon as a material, is connect to a wire including an aluminum based material; connecting the wire is conducted using a condition which is a larger ultrasonic wave output and a lower load, when compared to a case where the electrode pads on the first electronic part and the second electronic part, which include an aluminum based material or gold, are connected to a wire including an aluminum based material or gold.

* * * * *